United States Patent [19]
Chaney et al.

[11] Patent Number: 5,985,697
[45] Date of Patent: Nov. 16, 1999

[54] METHOD AND APPARATUS FOR MOUNTING AN INTEGRATED CIRCUIT TO A PRINTED CIRCUIT BOARD

[75] Inventors: Ken W. Chaney, Palo Alto; Charles Ingalz, San Jose, both of Calif.

[73] Assignee: Sun Microsystems, Inc., Palo Alto, Calif.

[21] Appl. No.: 08/642,216

[22] Filed: May 6, 1996

[51] Int. Cl.$^6$ ............................................. H01L 21/44
[52] U.S. Cl. ............................ 438/122; 257/718; 257/719
[58] Field of Search ................................. 257/718, 717, 257/719, 712; 438/122

[56] References Cited

U.S. PATENT DOCUMENTS

| | | | |
|---|---|---|---|
| 4,415,025 | 11/1983 | Horvath | 257/718 |
| 4,514,752 | 4/1985 | Engel et al. | 438/122 |
| 5,459,352 | 10/1995 | Layton et al. | 257/718 |
| 5,786,635 | 7/1998 | Alcoe et al. | 257/718 |
| 5,838,064 | 11/1998 | Shimada et al. | 257/718 |

*Primary Examiner*—Kevin M. Picardat
*Attorney, Agent, or Firm*—Beyer & Weaver, LLP

[57] ABSTRACT

An apparatus for mounting an integrated circuit chip to a main printed circuit board is disclosed. The mounting apparatus is particularly suitable for situations in which a cooling device of significant mass is used to cool the integrated circuit chip. In one embodiment, the mounting apparatus mounts the integrated circuit chip onto a daughter or sub-printed circuit (PC) board, attaches the cooling device to the integrated circuit chip, supports the cooling device (as well as the integrated circuit chip and the daughter or sub-PC board) with support members, and uses flexible conductors to electrically connect the daughter or sub-PC board to the main printed circuit board. In another embodiment, the mounting apparatus attaches the cooling device to the integrated circuit chip, supports the cooling device (as well as the integrated circuit chip) with support members, and uses a flexible connection means to electrically connect the integrated circuit chip to the printed circuit board. In either case, inertial loads, particularly those associated with the mass of the cooling device, induced by impulse forces or vibrations are shielded from damaging the connections between the integrated circuit chip and the associated printed circuit board. A method for mounting an integrated circuit is also disclosed.

15 Claims, 6 Drawing Sheets

METHOD AND APPARATUS FOR MOUNTING AN INTEGRATED CIRCUIT TO A PRINTED CIRCUIT BOARD

BACKGROUND OF THE INVENTION

1. Field of the Invention

The present invention relates to integrated circuits and, more particularly, to techniques for mounting integrated circuits onto printed circuit boards.

2. Description of the Related Art

As integrated circuits become more complex, gate density, number of gates and fabrication complexity of integrated circuit chips all tend to increase. The power consumed by these integrated circuit chips has similarly increased as the number of gates has increased. Due to the increases in gate densities, number of gates and power consumption within many integrated circuits chips, it becomes important to manage the heat generated by these integrated circuit chips to prevent overheating. Specifically, it becomes necessary to provide a cooling device (e.g., a heat sink) to cool many integrated circuit chips. For example, high performance integrated circuit chips such as high performance microprocessors typically must be cooled. Typically, the cooling device is a heat sink which is placed on the integrated circuit chip to be cooled. The heat sink has high thermal conductivity so that heat is dissipated along its surface area which is substantially larger than the surface area of the integrated circuit chip to be cooled. The heat which is transferred to the heat sink from the integrated circuit chip is then dispersed into air which surrounds or flows over the heat sink. The air flow is typically provided by a fan. Complicated liquid cooled heat sinks have also been used for more demanding cooling tasks.

FIG. 1 is a diagram illustrating an example of a mounting 100 of an integrated circuit chip to a printed circuit board using conventional techniques. Specifically, FIG. 1 illustrates a printed circuit board 102 having integrated circuit chips 104 and 106 mounted thereon. The integrated circuit chips 104 and 106 in this illustrated embodiment are mounted directly to the printed circuit board 102 using pins 108. The pins 108 could, for example, be pins of a Pin Grid Array (PGA). Alternatively, a Ball Grid Array (BGA) mounting technique could use solder balls instead of the pins 108. Also, assuming that the integrated circuit chip 104 is a high performance device which requires a heat sink, a heat sink 110 is placed on the top of the integrated circuit chip 104. The heat sink 108 is typically held in place using an adhesive 112. The adhesive 112 preferably has a high thermal conductivity. The heat sink 110 could also be held in place with screws, bolts or clips.

A problem with the mounting 100 approach as illustrated in FIG. 1 is that when the printed circuit board 102 or the system (e.g., cabinet, box, machine, etc.) in which the printed circuit board 102 resides is subjected to impulse forces or vibrations, the mass of the heat sink 110 together with the mass of the integrated circuit chip 104 induce an inertial load on the pins 108. An impulse force could arise from a number of situations any of which tend to accelerate the printed circuit board 102 or the system in which the main printed circuit board resides. For example, the printed circuit board 102 or the system may be accidentally dropped onto the floor, a shipper may throw or jar a box containing the printed circuit board 102 or the system a substantial distance, and the like. The resulting inertial load on the pins 108 can be substantial, particularly when the mass of the heat sink 108 is substantial. As a result, the pins 108 of the integrated circuit chip 104 are subjected to loads (inertial loads) which are substantially larger than they are design to withstand. Consequently, impulse forces or vibrations can cause the pins 108 (or other mounting technique) to break or otherwise become damaged such that the integrated circuit chip 104 is no longer reliably electrically connected to the printed circuit board 102.

Thus, there is a need for an improved technique for mounting an integrated circuit chip to a printed circuit board such that inertial loads, particularly those associated with the mass of the heat sink, are shielded from damaging the connections between the integrated circuit chip and the associated printed circuit board.

SUMMARY OF THE INVENTION

Broadly speaking, the invention relates to improved techniques for mounting an electrical or electronic component to a printed circuit board in cases where a cooling device of significant mass is provided to cool the electrical or electronic component. Preferably, the electrical or electronic component is an integrated circuit chip. One technique according to the invention mounts the integrated circuit chip onto a daughter or sub-printed circuit (PC) board, attaches the cooling device to the integrated circuit chip, supports the cooling device (as well as the integrated circuit chip and the daughter or sub-PC board) with support members, and uses flexible conductors to electrically connect the daughter or sub-PC board to the printed circuit board. Another technique according to the invention attaches the cooling device to the integrated circuit chip, supports the cooling device (as well as the integrated circuit chip) with support members, and uses a flexible connection means to electrically connect the integrated circuit chip to the printed circuit board. In either case, inertial loads, particularly those associated with the mass of the cooling device, induced by impulse forces are shielded from damaging the connections between the integrated circuit chip and the associated printed circuit board. Thus allowing the printed circuit board to withstand greater impulse forces and/or vibrations without damaging its connections.

The invention may be implemented in numerous ways, including as an apparatus and a method. Several implementations are discussed below.

As an apparatus for attaching an electronic device to a printed circuit board, an embodiment of the invention includes: a sub-printed circuit board having the electronic device mounted thereon and electrically coupled thereto; flexible electrical conductors which electrically couple conductive traces on the daughter printed circuit board to conductive traces on the printed circuit board; a cooling device thermally coupled to the electronic device to dissipate heat from the electronic device; and at least one mechanical support member to support the cooling device so that electrical connections from the electronic device are not subjected to mechanical or inertial loads due to the mass of the cooling device. Preferably, the electronic device is an integrated circuit chip and the cooling device is a heat sink.

As an apparatus for attaching an integrated circuit chip to a printed circuit board, another embodiment of the invention includes: flexible connection means for electrically coupling the integrated circuit chip to the printed circuit board in a flexible manner; a cooling device thermally coupled to the integrated circuit chip; and support means for supporting the cooling device and the integrated circuit chip relative to and offset from the printed circuit board.

As a method for mounting an integrated circuit chip to a main printed circuit (PC) board, an embodiment of the invention includes the operations of: providing a sub-PC board having connection pads or holes corresponding to connection pads, balls, leads or pins of the integrated circuit chip; mounting the integrated circuit chip onto the sub-PC board; mechanically and thermally coupling the integrated circuit chip to a cooling device; flexibly and electrically connecting the sub-PC board to the main PC board without affixing the sub-PC board to the main PC board; and mechanically supporting the cooling device with respect to the main PC board such that mechanical and electrical connections between the integrated circuit chip and the sub-PC board are isolated from inertial loads due to the cooling device.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 2A–6B. However, those skilled in the art will readily appreciate that the detailed description given herein with respect to these figures is for explanatory purposes as the invention extends beyond these limited embodiments.

The method and apparatus for mounting an integrated circuit chip to a printed circuit board according to the invention utilizes an improved mounting technique that is particularly useful in cases where a cooling device of significant mass is provided to cool the integrated circuit chip. One improved technique according to the invention mounts the integrated circuit chip onto a daughter or sub-printed circuit (PC) board, attaches the cooling device to the integrated circuit chip, supports the cooling device (as well as the integrated circuit chip and the daughter or sub-PC board) with support members, and uses flexible conductors to electrically connect the daughter or sub-PC board to the main printed circuit board. Another technique according to the invention attaches the cooling device to the integrated circuit chip, supports the cooling device (as well as the integrated circuit chip) with support members, and uses a flexible connection means to electrically connect the integrated circuit chip to the printed circuit board. In either case, inertial loads, particularly those associated with the mass of the cooling device, induced by impulse forces or vibrations are shielded from damaging the connections between the integrated circuit chip and the associated printed circuit board.

Figure 1:
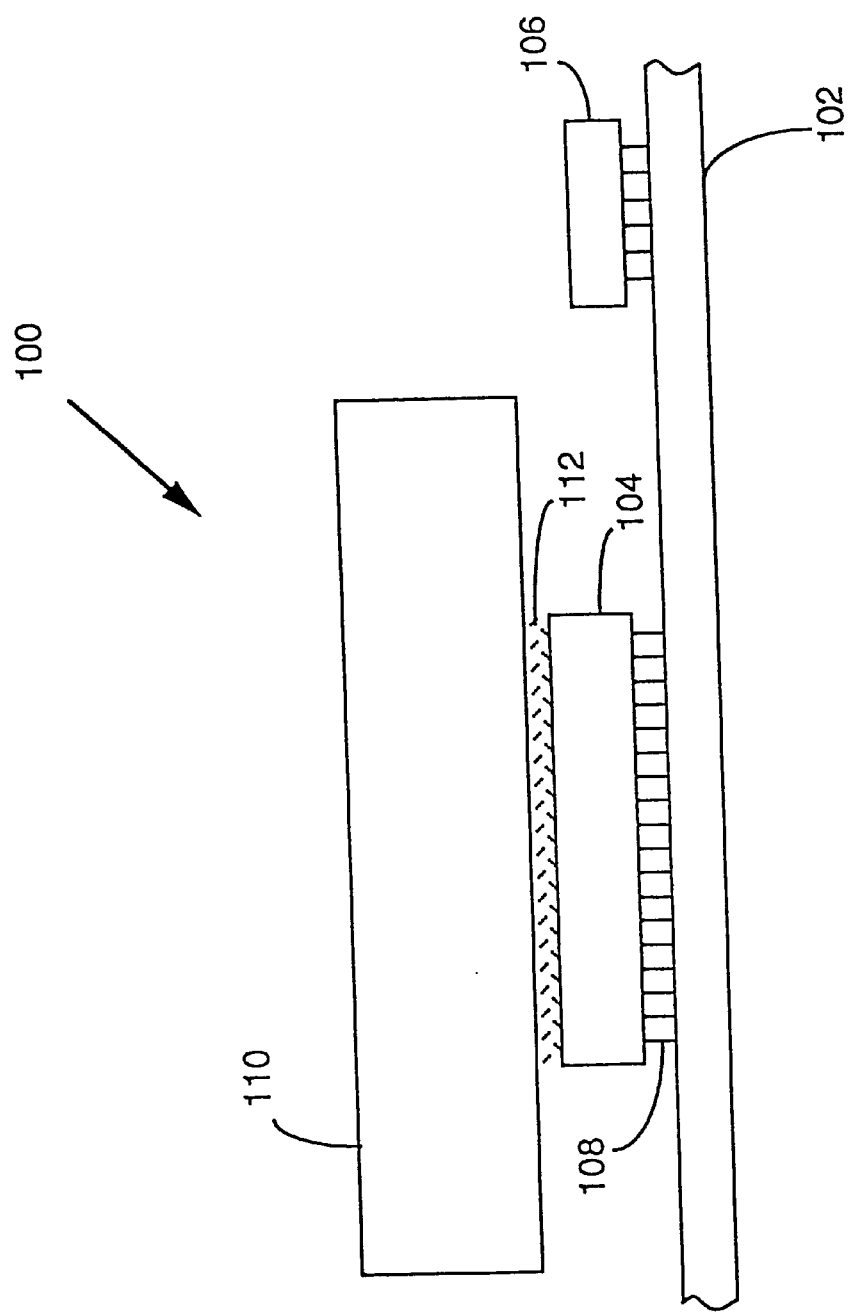
FIG. 1 is a diagram illustrating an example of a mounting of an integrated circuit chip to a printed circuit board using conventional techniques.
Figure 2A:
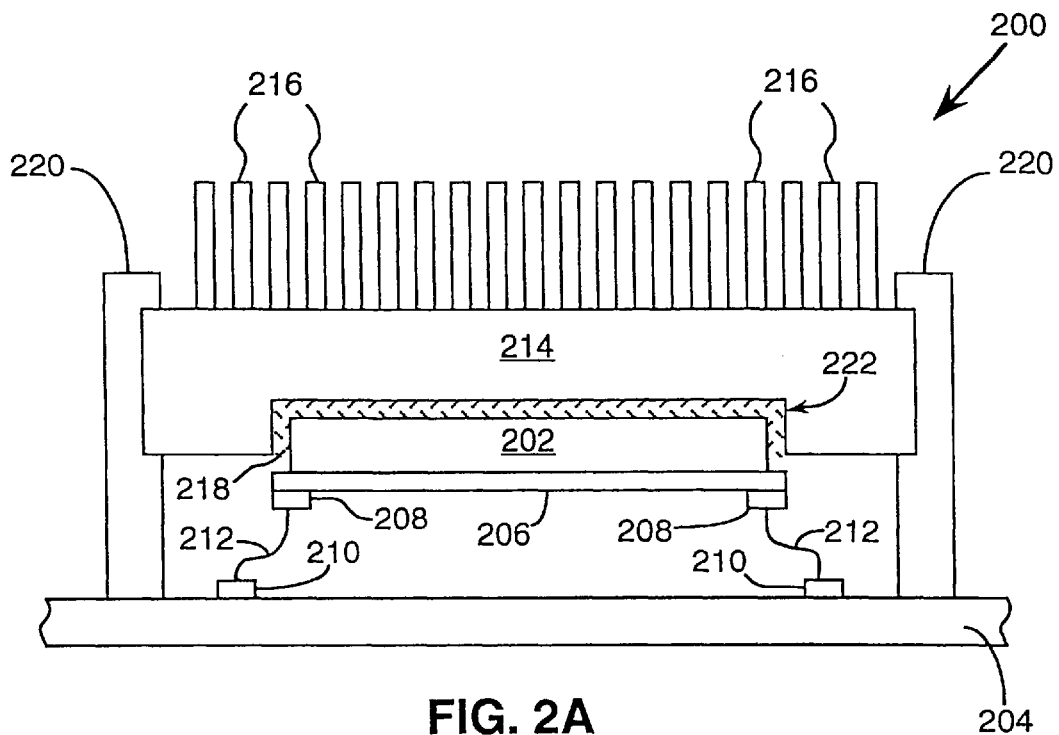
FIG. 2A is a diagram of a mounting apparatus according to a first embodiment of the invention.

FIG. 2A is a diagram of an mounting apparatus 200 according to a first embodiment of the invention. The mounting apparatus 200 couples an integrated circuit chip 202 to a main printed circuit board 204. The integrated circuit chip 202 is, however, not directly mounted to the main printed circuit board 204. Instead, the integrated circuit chip 202 is directly mounted on a daughter printed circuit board 206. Normally, the daughter printed circuit board 206 will be lighter and smaller that the main printed circuit board 204. Preferably, the daughter printed circuit board 206 is of a size to have the integrated circuit chip 202 mounted thereto without a great deal of excess, whereas the main printed circuit board 204 is substantially larger as is supports many other integrated circuits and components. The technique by which the integrated circuit chip 202 is mounted to the daughter printed circuit board 206 can vary and may include the use of pins, balls, pads, etc. which are all well known in the art.

The daughter printed circuit board 206 is electrically connected to the main printed circuit board 204, but is not mounted on the main printed circuit board 204. Instead, the daughter printed circuit board 206 is held offset from the main printed circuit board 204 as will be described. Preferably, the daughter printed circuit board 206 has connection pads 208 to facilitate electrical connection of its various wire traces to the main printed circuit board 204. The main printed circuit board 204 also preferably includes connection pads 210 to facilitate electrical connection of its various wire traces to the daughter printed circuit board 206. The connection pads 208 of the daughter printed circuit board 206 then electrically connected to the connection pads 210 of the main printed circuit board 204 via flexible conductors 212. The flexible conductors 212 are preferably included within a flexible thin film. The pads within the flexible thin film can then be soldered to the pins, balls, pads, etc. On the respective printed circuit boards. The flexible conductors 212 could also be used without the connection pads 208 and 210 in which case the flexible conductors 212 could, for example, electrically couple the main printed circuit board 204 and the daughter printed circuit board 206 directly using holes in the respective printed circuit boards.

In addition, the mounting apparatus 200 includes a cooling device 214 mounted on the top surface of the integrated circuit chip 202. The top side of the integrated circuit chip 202 is the non-connector (e.g., non-pin) side. The cooling device 214 preferably includes a plurality of cooling fins 216 which help to dissipate heat from the cooling device 214. A thermally conductive adhesive 218 is preferably used to not only adhere the cooling device 214 to the integrated circuit chip 202 but also to provide a good thermally conductive path between the integrated circuit chip 202 and the cooling device 214. The cooling device 214 can alternatively or additionally be held against the integrated circuit chip 202 by a screw, bolt, clip and the like. The cooling device 214 is held in place relative to, and offset from, the main printed circuit board 204 by support members 220. The support members 220 also hold the integrated circuit chip 202 and the daughter printed circuit board 206 in place (and offset) because they are attached to the cooling device 214.

Thus, the integrated circuit chip 202 and the daughter printed circuit board 206 are not directly and rigidly affixed to the main printed circuit board 204. Instead, the only coupling between the daughter printed circuit board 206 and the main printed circuit board 204 is pliable or flexible as provided by the flexible conductors 212.

When the entire mounting apparatus 200 is subjected to an impulse force, the pins, balls, or other connection technique which electrically and mechanically couples the integrated circuit chip 202 to the daughter printed circuit board 206 are subjected to an inertial load associated with the mass of the daughter printed circuit board 206 and a portion of the mass of the flexible conductors 212. Consequently, the mounting apparatus 200 shields the pins, balls, or other connection technique (which electrically and mechanically couples the integrated circuit chip 202 to a printed circuit board) from the large inertial load that is associated with the mass of the cooling device 214 (as well as the mass of the integrated circuit chip 202). The shielding occurs because the mass of the cooling device 214 is held in place relative to the main printed circuit board 204 by the support members 220. The support members 220 are preferably strong enough the support the weight of the cooling device 214 and rigid enough to allow only limited relative motion of the cooling device 214 with respect to the main printed circuit board 204.

Figure 2B:
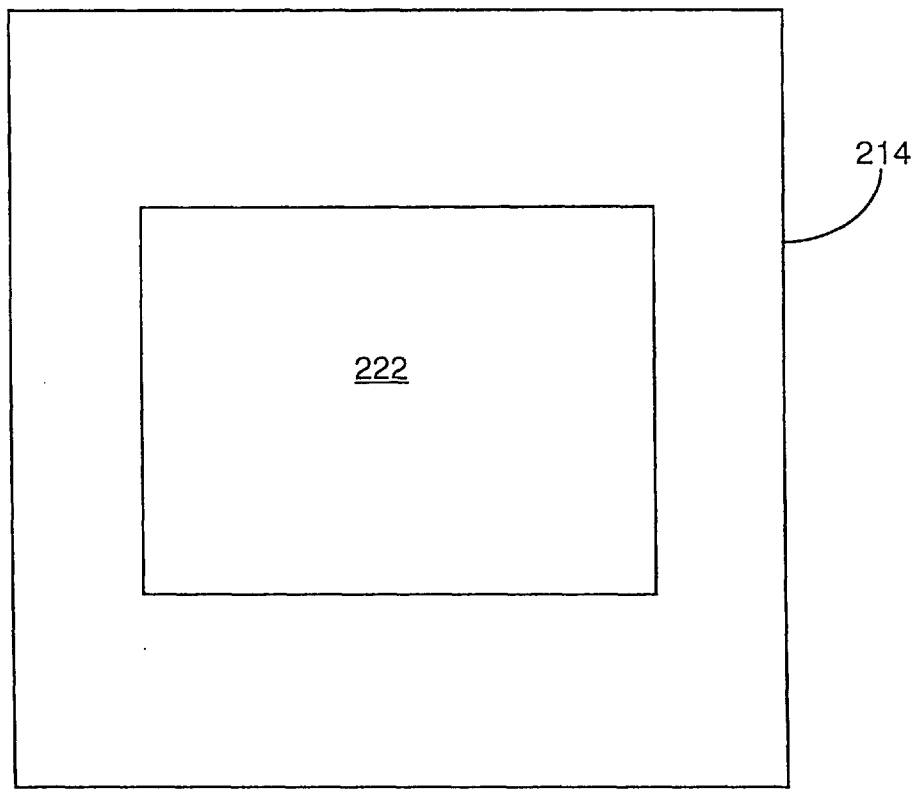
FIG. 2B is a plan view of the underside of the cooling device illustrated in FIG. 2A.

FIG. 2B is a plan view of the underside of the cooling device 214 according to the first embodiment of the invention illustrated in FIG. 2A. The cooling device 214 includes a cut-out region 222 formed on the underside center region of the cooling device 214. The size of the cut-out region 222 is machined or formed such that the integrated circuit chip 202 snugly fits within the cut-out region 222.

Figure 3:
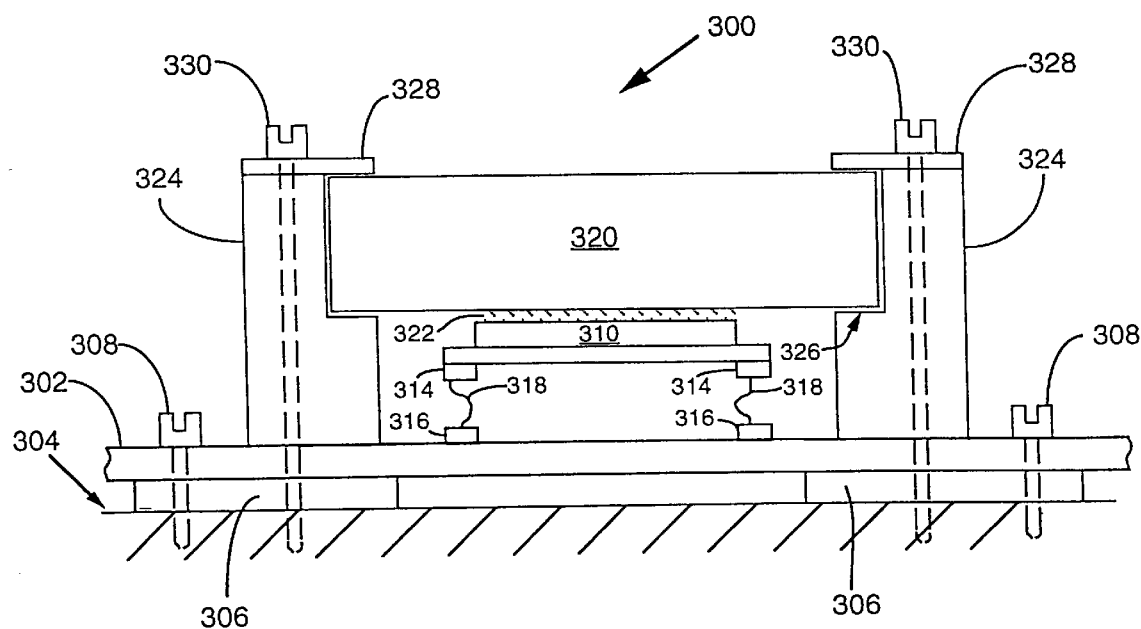
FIG. 3 is a diagram of a mounting apparatus according to a second embodiment of the invention.

FIG. 3 is a diagram of a mounting apparatus 300 according to a second embodiment of the invention. The mounting apparatus 300 is affixed to a main printed circuit board 302. The main printed circuit board 302 is itself affixed to a chassis 304. The chassis 304 could, for example, be a box, unit or system in which the main printed circuit board 302 as well as other circuitry and devices associated therewith reside. The main printed circuit board 302 is set off from the chassis 304 by spacers 306. Attachment members 308 affix the main printed circuit board 302 to the chassis 304. As illustrated in FIG. 3, the attachment members 308 may be bolts or screws which extend through the main printed circuit board 302 and the spacers 306 to thread into the chassis 304.

The mounting apparatus 300 includes an integrated circuit chip 310 which must be not only electrically coupled to the main printed circuit board 302 but also thermally coupled to a cooling device to dissipate heat from the integrated circuit chip 310. The integrated circuit chip 310 is mounted to a daughter printed circuit board 312 using conventional mounting techniques (e.g., pins, balls, pads, etc.). For example, the bottom side of the integrated circuit chip 310 may have pins extending therefrom which are placed in corresponding holes in the daughter printed circuit board 312 when the integrated circuit chip 310 is mounted onto the daughter printed circuit board 312, thereby electrically and mechanically coupling the integrated circuit chip 310 to the daughter printed circuit board 312. Alternatively, balls on the bottom side of the integrated circuit chip 310 could electronically and mechanically couple to pads on the daughter printed circuit board 312.

The daughter circuit board 312 is electrically coupled to the main printed circuit board 302 without being mounted or affixed thereto. In other words, although electrically coupled, the daughter printed circuit board 312 is offset from the main printed circuit board 302. In FIG. 3, the daughter printed circuit board 312 is offset above the main printed circuit board 302. To facilitate the electrical interconnection between the daughter printed circuit board 312 and the main printed circuit board 302, the daughter printed circuit board 312 includes conductive pads 314 and the main printed circuit board 302 includes conductive pads 316. The conductive pads 314 of the daughter printed circuit board 312 are electrically connected to the conductive pads 316 of the main printed circuit board 302 using flexible conductors 318. Preferably, the flexible connectors 318 are contained within a flexible thin film. The flexibility of the flexible connectors 318 allows the daughter printed circuit board 312 (and the integrated circuit chip 310) to move relative to the main printed circuit board 302 without damaging the electrical interconnections.

The mounting apparatus 300 also includes a cooling device 320. The cooling device 320 is placed against the top side of the integrated circuit chip 310. A thermally conductive adhesive 322 is preferably placed between the integrated circuit chip 310 and the cooling device 320 to hold the integrated circuit chip 310 in place against the cooling device 320. The thermal adhesive 322 also enhances the thermal conductivity between the integrated circuit chip 310 and the cooling device 320. Alternatively, or additionally, the integrated circuit chip 310 can be held against the cooling device 320 with a bolt, screw or other suitable attachment means.

The cooling device 320 is also held in place with respect to the main printed circuit board 302 and the chassis 304 by support members 324. In this embodiment, the support members 324 are pillars which extend outwards from the surface of the main printed circuit board 302 and include a notch 326 that supports the cooling device 320 at a fixed distance above the main printed circuit board 302. The support members 324 are strong enough to support the weight of the cooling device 320 and rigid enough to undergo only minimal movement relative to the main printed circuit board 302 after a sizable impulse force (e.g., several hundred Newtons). The support members 324 also include removable locking devices 326 which prevent removal of the cooling device 320 when in place. Constructing the support members 324 and the locking devices 328 as illustrated in FIG. 3 may facilitate different assembly techniques. Also, attachment members 330 may traverse through holes in the support members 324 and thread into either the main printed circuit board 302, the spacers 306 or the chassis 304 to firmly affix the position of the support members 324 relative to the main printed circuit board 302 and/or the chassis 304.

The mounting apparatus 300 isolates the mass of the cooling device 320 from stressing the mounting (connection) technique of the integrated circuit chip 310 to the daughter printed circuit board 312. Hence, when an impulse force acts on a box, unit or system including the main printed circuit board 302, inertial loads acting on the mounting (e.g., pins, leads, balls, pads, etc.) are not affected by the mass of the cooling device 320 (or by the mass of the integrated circuit chip 310). The shielding occurs because the mass of the cooling device 320 is held in place relative to the main printed circuit board 302 by the support members 320. The support members 324 are preferably strong enough the support the weight of the cooling device 324 and rigid enough to allow only limited relative motion of the cooling device 320 with respect to the main printed circuit board 302.

Figure 4A:
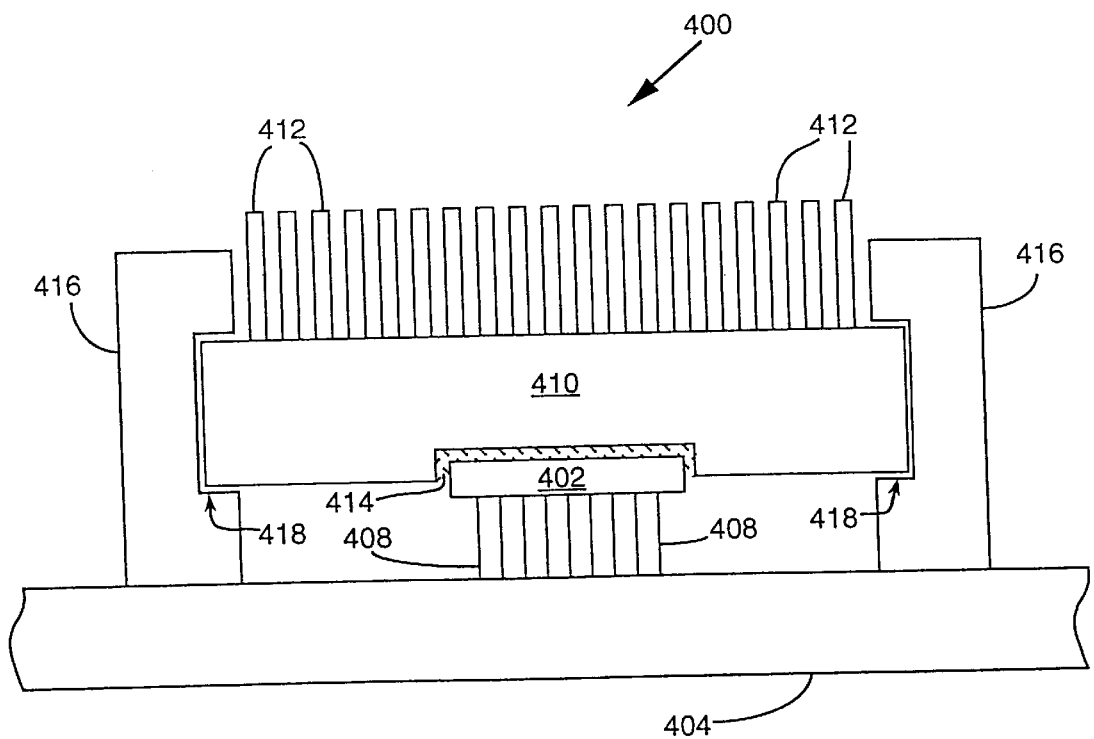
FIG. 4A is a diagram of a mounting apparatus according to a third embodiment of the invention.

FIG. 4A is a diagram of a mounting apparatus 400 according to a third embodiment of the invention. The mounting apparatus 400 electrically couples an integrated circuit chip 402 to a main printed circuit board 404 without rigidly attaching the integrated circuit chip 402 to the main printed circuit board 404. The integrated circuit chip 402 is coupled to the main printed circuit board 404 using extended length pins 408. The extended length pins operate to electrically couple the integrated circuit chip 402 to the main printed circuit board 404 in a mechanically flexible manner. Note that the integrated circuit chip 402 is not directly affixed to the main printed circuit board 404 but is offset therefrom by a predetermined distance. The predetermined distance varies with design and could, for example, be from about 5 millimeters to about 5 centimeters.

The mounting apparatus 400 also includes a cooling device 410. The cooling device 410 includes cooling fins 412 to help dissipate the heat from the cooling device 410 to nearby air. The cooling device 410 is attached to the top surface of the integrated circuit 402. Preferably, a thermally conductive adhesive 414 is used to bond the cooling device 410 to the integrated circuit chip 402; however, other mechanical attachment techniques may be used (e.g., screw, bolt, clip, etc.).

Additionally, the mounting apparatus 400 includes mechanical support members 416 which affix the cooling device 410 to the main printed circuit board 414. The mechanical support members 416 have a notch 418 fabricated therein to hold the cooling device 410 in a fixed position relative to the main printed circuit board 404. In addition to (or in place of) the notches 418, the support members 416 may also use adhesive, screws, bolts or some other attachment means to hold the cooling device 410 in a fixed, offset position relative to the main printed circuit board 404.

Like the first and second embodiments, the mounting apparatus 400 of the third embodiment isolates the mass of the cooling device 410 from stressing the mounting (connection) technique of the integrated circuit chip 402 to the main printed circuit board 404. Hence, when an impulse force acts on a box, unit or system including the main printed circuit board 404, inertial loads acting on the mounting (e.g., pins, leads, balls, pads, etc.) are not affected by the mass of the cooling device 410 (or by the mass of the integrated circuit chip 402). The isolation occurs because the mass of the cooling device 410 is held in place relative to the main printed circuit board 404 by the support members 416. The support members 416 are preferably strong enough the support the weight of the cooling device 410 and rigid enough to allow only limited relative motion of the cooling device 410 with respect to the main printed circuit board 404.

Figure 4B:
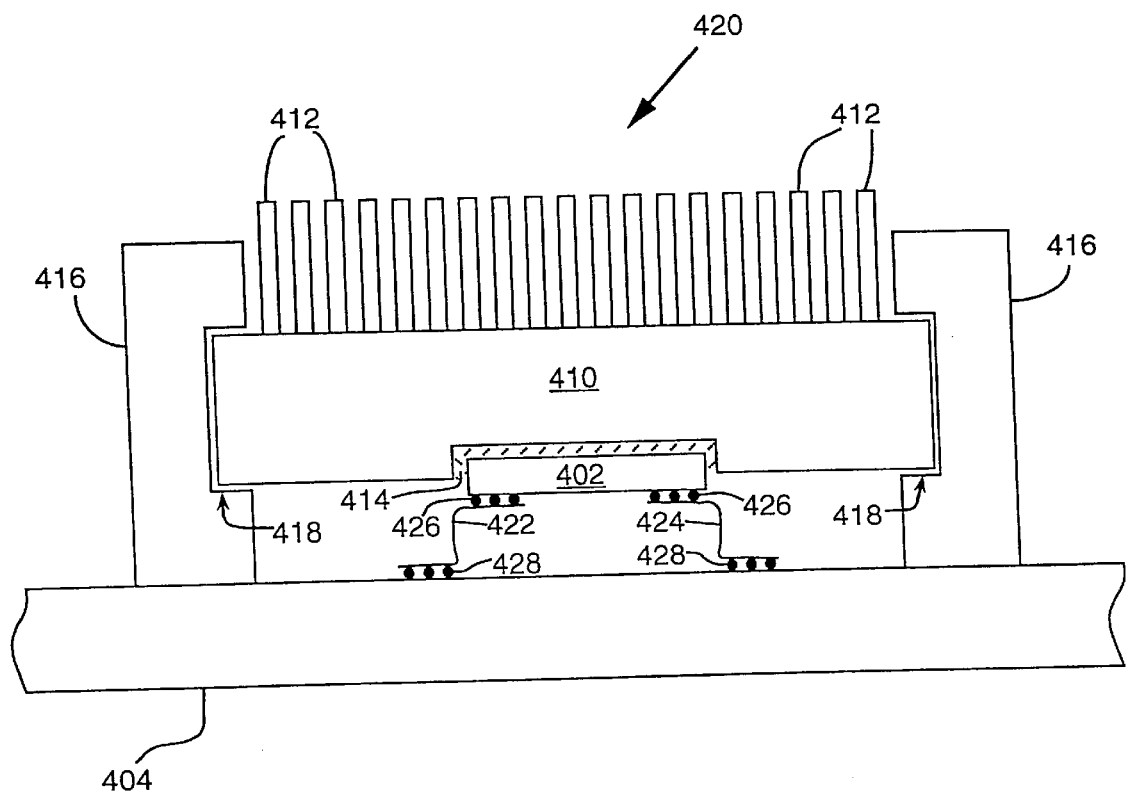
FIG. 4B is a diagram of a mounting apparatus according to a fourth embodiment of the invention.

FIG. 4B is a diagram of a mounting apparatus 420 according to a fourth embodiment of the invention. The mounting apparatus 420 is the same as the mounting apparatus 400 according to the third embodiment of the invention except that the pins 408 are replaced by a flexible electrical connections 422 and 424. Preferably, the flexible electrical connections 422 and 424 are implemented by a flexible thin film. A first end of the flexible electrical connections 422 and 424 electrically couples to the integrated circuit chip 402 with solder balls 426 and a second end of the flexible electrical connections 422 and 424 electrically couples to the main printed circuit board 404 with solder balls 428.

Note unlike the first and second embodiments, the third and fourth embodiments of the invention do not require the usage of a daughter printed circuit board or a sub-PC board. However, a daughter printed circuit board or a sub-PC board could be used with the third and fourth embodiments between the flexible electrical connections 422 and 424 and the integrated circuit chip 402 to ease the connections to the integrated circuit chip 402.

In each embodiment of the invention discussed above, the mass of the cooling device is isolated from the pins, leads or balls of the integrated circuit chip. Consequently, when an impulse force is applied to a system which includes the main printed circuit board with a mounting apparatus according to the invention affixed thereto, the interconnections from the integrated circuit chip are not damaged. Specifically, only the mass associated with the daughter printed circuit board and/or perhaps a portion of the mass of the flexible conductors (or flexible connections) induces an inertial load on the pins, leads, balls or other mounting technique from the integrated circuit chip. Because the daughter printed circuit board and/or the flexible conductors (or flexible connections) are normally small and light weight (relative to the larger and heavier main printed circuit board), the resulting inertial load on the pins, leads, balls or other mounting (connection) technique is minimal so that no damage results. The resulting inertial loads induced on the leads, pins, balls or other mounting technique are thus kept low so that electronic connections are more reliable and mechanical integrity is maintained.

Numerous other embodiments are possible. For example, the embodiments in FIGS. 2A, 3, 4A and 4B could by configured upside down with the heat sink nearest the main printed circuit board and the integrated circuit chip coupled to the top side of the heat sink. Also, the flexible electrical connections from the integrated circuit chip (possible through a daughter circuit board) to the main printed circuit board need not be confined to regions directly between the integrated circuit chip and the main printed circuit board. As an example, the flexible electrical connections could extend outside of the support members or, in the upside down arrangement, could couple to the bottom surface of the integrated circuit chip (which has its top surface coupled to the heat sink).

The impulse force could rise from a number of situations any of which tend to accelerate the main printed circuit board or a system in which the main printed circuit board resides. For example, the system may be accidentally dropped onto the floor, a shipper may throw the box containing the system a substantial distance, and the like.

Figure 5A:
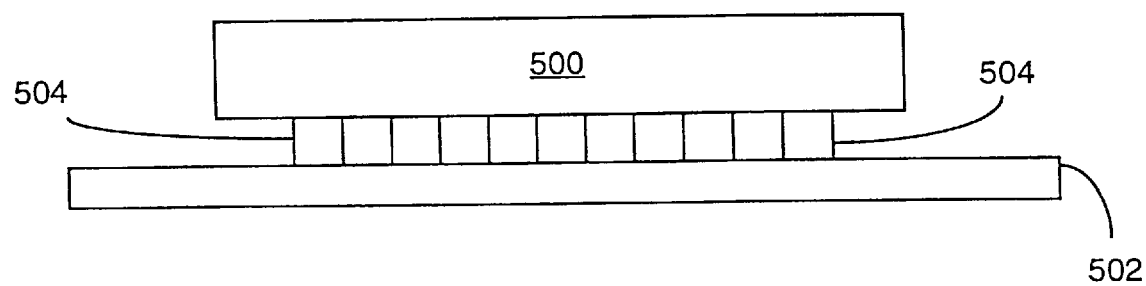
FIGS. 5A–5C are diagrams of different techniques for mounting an integrated circuit chip to a daughter printed circuit board.
Figure 5B:
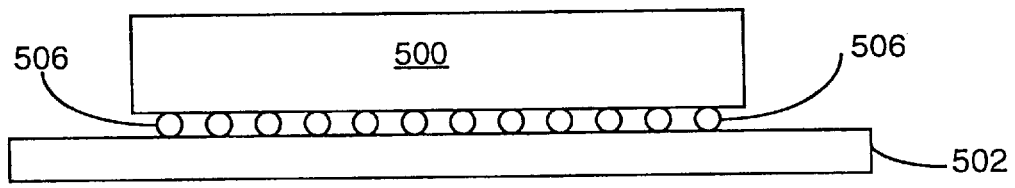
Figure 5C:
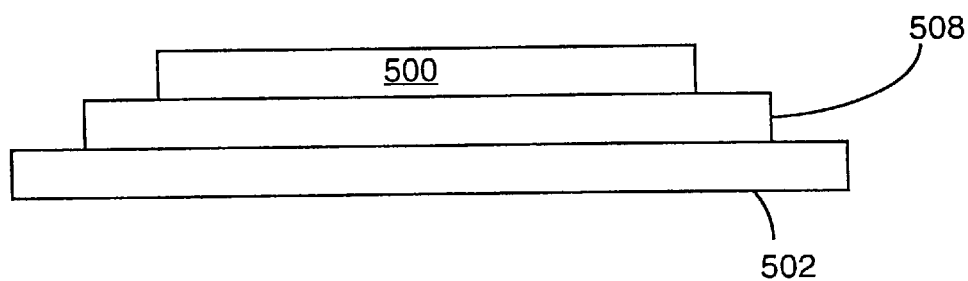

Any of the above-described embodiments of the invention can use many different mounting techniques (or connection techniques) to affix an integrated circuit chip to a daughter printed circuit board. FIGS. 5A–5C are diagrams of some different techniques which are available for mounting an integrated circuit chip 500 to a daughter printed circuit board 502. In FIG. 5A, pins 504 from the integrated circuit chip 500 are placed into corresponding holes that have been designed into the daughter printed circuit board 502. The pins 504 are then soldered in place in the holes, thereby electrically connecting the integrated circuit chip 500 to the daughter printed circuit board 502. In FIG. 5B, the integrated circuit chip 500 includes solder balls on its under side. When the integrated circuit chip 500 is placed and aligned on the daughter printed circuit board 502, the soldered balls 506 contact with contact pads on the upper surface of the main printed circuit board 502. Then, heat is applied to the soldered balls such that the solder balls become slightly molten so as to electrically (and mechanically) couple with corresponding contact pads on the daughter printed circuit board 502. In FIG. 5C, the integrated circuit chip 500 couples to the daughter printed circuit board 502 via a socket connector 508. Typically, the integrated circuit chip 500 includes pins which are placed into holes in the socket connector 508. The socket connector 508 then locks the pins in place so that the integrated circuit chip 500 is firmly attached and electrically coupled to the socket connector 508. As an example, the socket connector 508 could be the commonly used zero insertion force (ZIF) socket. The socket connector 508 is then in turn electrically and mechanically coupled to the daughter printed circuit board 502. For example, the socket connector 508 typically itself has pins which are placed into holes of the daughter printed circuit board 502 and then soldered in place. Regardless of the connection technique used to mounting the integrated circuit chip 500 to the daughter printed circuit board 502, the connections provide mechanical as well as electrical connections.

Figure 6A:
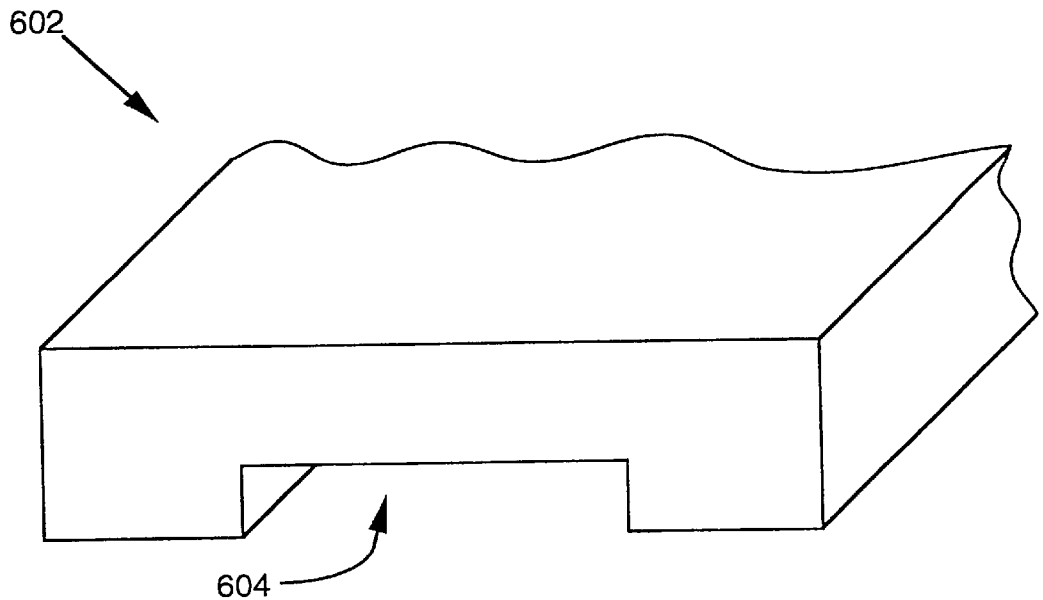
FIGS. 6A and 6B are diagrams of different embodiments of cooling devices that are suitable for use with the invention.
Figure 6B:
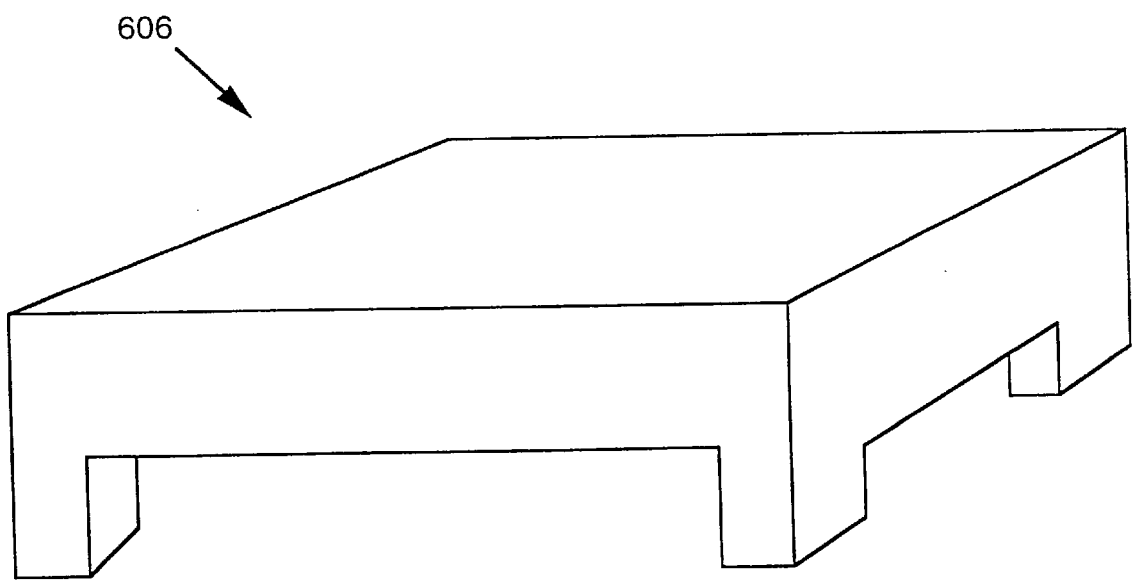

The cooling devices 214, 320 and 410 used in the above-described embodiments of the invention may be designed and constructed in a variety of different shapes, materials and configurations. FIGS. 6A and 6B are diagrams of two different configurations for cooling devices that are suitable for use with the present invention. Typically, the cooling devices are heat sinks fabricated from aluminum or copper. In FIG. 6A, a cooling device 602 is a parallelepiped structure having a slot 604 extending there through. This embodiment may be more suitable in situations in which two adjacent integrated circuit chips are being cooled by the same cooling device, namely the cooling device 602. Otherwise, if only a single integrated circuit chip is being cooled by the cooling device, the cut-out 222 illustrated in FIG. 2B may be preferred over the slot 604 illustrated in FIG. 6A. In FIG. 6B, a cooling device 606 is constructed such as to have the support members integrally formed therewith.

The support members 220, 324 and 416 used in the above-described embodiments of the invention may also be designed and constructed in a variety of different shapes, materials and configurations. However the support members are constructed, the support members must be strong enough to hold the mechanical load associated with the cooling device. It is also preferred that the support members be stiff so that the cooling device does not move significantly relative to the main printed circuit board during impulse forces. Some movement, however, is not problematic because the flexible conductors are in fact flexible enough to compensate for any slight deformations that occur by deformations (lack of stiffness) of the support members.

The main printed circuit board need not in fact be the main printed circuit board of a system. Instead, the main printed circuit board can be any printed circuit board capable of having at least one integrated circuit chip mounted thereon.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An apparatus for attaching an electronic device to a printed circuit board, said apparatus comprising:
   a sub-printed circuit board having the electronic device mounted thereon and electrically coupled thereto;
   flexible electrical conductors, said flexible electrical conductors electrically couple conductive traces on said sub-printed circuit board to conductive traces on the printed circuit board;
   a cooling device thermally coupled to the electronic device, said cooling device operating to dissipate heat from the electronic device; and
   at least one mechanical support member, said at least one mechanical support member supports said cooling device so that electrical connections from the electronic device are not subjected to mechanical or inertial loads due to the mass of said cooling device.

2. An apparatus as recited in claim 1,
   wherein the printed circuit board includes first pads coupled to the conductive traces thereon, and said sub-printed circuit board includes second pads coupled to conductive traces thereon, and
   wherein said flexible electrical conductors electrically couple the second pads on said sub-printed circuit board to the first pads on the printed circuit board.

3. An apparatus as recited in claim 1, wherein said at least one mechanical support member is affixed to the printed circuit board.

4. An apparatus as recited in claim 1, wherein said at least one mechanical support member is affixed to a chassis.

5. An apparatus as recited in claim 1, wherein said apparatus comprises a plurality of said mechanical support members.

6. An apparatus as recited in claim 1, wherein said flexible electrical conductors are contained within a flexible thin film.

7. An apparatus as recited in claim 1, wherein said flexible electrical conductors are extended length pins from the electronic device.

8. An apparatus as recited in claim 1, wherein said electronic device is an integrated circuit chip.

9. An apparatus as recited in claim 1, wherein the electronic device is an integrated circuit chip, and the integrated circuit chip is mounted to said sub-printed circuit board directly or via a socket device.

10. An apparatus as recited in claim 9, wherein the integrated circuit chip is a microprocessor.

11. An apparatus as recited in claim 9, wherein the integrated circuit chip couples to said sub-printed circuit board or the socket device using ball-grid, pin-grid or surface mount connection techniques.

12. An apparatus as recited in claim 1, wherein said cooling device is a heat sink.

13. An apparatus for attaching an integrated circuit chip to a printed circuit board, said apparatus comprising:
   a daughter-printed circuit board, the integrated circuit chip being attached to said daughter-printed circuit board;
   flexible connection means for electrically coupling said daughter-printed circuit board to said printed circuit board in a flexible manner;
   a cooling device thermally coupled to the integrated circuit chip; and support means for supporting said cooling device and the integrated circuit chip relative to and offset from the printed circuit board.

14. An apparatus as recited in claim 13, wherein said apparatus further comprises a socket device interposed between the integrated circuit chip and said daughter printed circuit board such that the integrated circuit chip is mounted to said daughter printed circuit board via said socket device.

15. An apparatus as recited in claim 14, wherein said cooling device is a heat sink.

* * * * *